United States Patent [19]

Fan et al.

[11] Patent Number: 5,607,814

[45] Date of Patent: *Mar. 4, 1997

[54] PROCESS AND ELEMENT FOR MAKING A RELIEF IMAGE USING AN IR SENSITIVE LAYER

[75] Inventors: Roxy N. Fan, East Brunswick, N.J.; Reid E. Kellogg, Wilmington, Del.

[73] Assignee: E. I. Du Pont de Nemours and Company, Wilmington, Del.

[ * ] Notice: The portion of the term of this patent subsequent to Nov. 16, 2010, has been disclaimed.

[21] Appl. No.: 926,887

[22] Filed: Aug. 7, 1992

[51] Int. Cl.$^6$ ............................................. G03C 1/76
[52] U.S. Cl. ..................... 430/258; 430/306; 430/273.1; 430/5; 101/401.1
[58] Field of Search ............................ 430/199, 200, 430/201, 256, 258, 259, 306, 273, 394, 273.1, 5; 101/401.1; 346/76 L

[56] References Cited

U.S. PATENT DOCUMENTS

| | | | |
|---|---|---|---|
| 2,760,863 | 8/1956 | Plambeck, Jr. | 430/306 |
| 3,458,311 | 7/1969 | Alles et al. | 430/276 |
| 3,619,601 | 11/1971 | Gush et al. | 430/306 |
| 3,867,150 | 2/1975 | Ketley | 96/36.3 |
| 3,945,318 | 3/1976 | Landsman | 101/467 |
| 3,964,389 | 6/1976 | Peterson | 101/467 |
| 4,020,762 | 5/1977 | Peterson | 101/467 |
| 4,072,524 | 2/1978 | Fan | 430/273 |
| 4,132,168 | 1/1979 | Peterson | 101/471 |
| 4,245,003 | 1/1981 | Oransky et al. | 428/323 |
| 4,559,294 | 12/1985 | Navarrete | 430/306 |
| 4,599,295 | 7/1986 | Kondo et al. | 430/156 |
| 4,624,891 | 11/1986 | Sato et al. | 428/913 |
| 4,770,739 | 9/1988 | Orvek et al. | 430/312 |
| 5,015,556 | 5/1991 | Martens | 430/306 |
| 5,085,976 | 2/1992 | Gibson, Jr. et al. | 430/306 |
| 5,156,938 | 10/1992 | Foley et al. | 430/200 |
| 5,185,186 | 2/1993 | Kawakami et al. | 427/332 |
| 5,192,641 | 3/1993 | Shaw et al. | 430/200 |
| 5,262,275 | 11/1993 | Fan | 430/273 |

FOREIGN PATENT DOCUMENTS

| | | |
|---|---|---|
| 0001138 | 3/1979 | European Pat. Off. . |
| 0065760 | 12/1982 | European Pat. Off. . |
| 0307835 | 3/1989 | European Pat. Off. . |
| 4007248A1 | 9/1991 | Germany . |
| 1118842 | 5/1989 | Japan ............................ 430/273 |

*Primary Examiner*—Martin Angebranndt
*Attorney, Agent, or Firm*—Thomas H. Magee

[57] ABSTRACT

A photosensitive element having an infrared imageable layer, and a process for making a relief image from such an element are disclosed.

15 Claims, No Drawings

5,607,814

PROCESS AND ELEMENT FOR MAKING A RELIEF IMAGE USING AN IR SENSITIVE LAYER

FIELD OF THE INVENTION

This invention relates to a process for making a relief image and, more particularly, to a process for making a relief image from a photosensitive element having a layer which is sensitive to infrared laser radiation. This invention also relates to a photosensitive element having an infrared-sensitive layer useful in making a flexographic printing plate.

BACKGROUND OF THE INVENTION

Photosensitive elements which can be used to make relief images are well known. The photosensitive compositions generally comprise a photoinitiator and a component which is capable of reacting with the initiator, after it has been activated by exposure to actinic radiation. The reaction of the initiator and the second component produces a change in the physical properties of the layer such that the exposed areas can be differentiated from the nonexposed areas.

Imagewise exposure of a photosensitive element requires the use of a phototool which is a mask having clear and opaque areas covering the photosensitive layer. The phototool prevents exposure and photoreaction in the non-image areas, so that the image can be later developed. The phototool is clear, i.e., transparent to actinic radiation, in the image areas so that those areas are exposed to radiation. The phototool is usually a photographic negative (or positive) of the desired printing image. If corrections are needed in the final image a new negative (or positive) must be made. This is a time-consuming process. In addition, the phototool may change slightly in dimension due to changes in temperature and humidity. Thus, the same phototool, when used at different times or in different environments, may give different results and could cause registration problems.

Thus, it would be desirable to eliminate the phototool by directly recording information on a photosensitive element, e.g., by means of a laser beam. The image to be developed could be translated into digital information and the digital information used to adjust the relative position of the material and laser for exposing. The digital information could even be transmitted from a distant location. Corrections could be made easily and quickly by adjusting the digitized image. In addition, the digitized image could be either positive or negative, eliminating the need to have both positive-working and negative-working photosensitive materials, or positive and negative phototools. This saves storage space and, thus, reduces cost. Another advantage is that registration can be precisely controlled by machine during the imaging step.

In general, it has not been very practical to use lasers for the imagewise exposure of the elements which are used to prepare relief images, e.g., flexographic printing plates. The elements frequently have low photosensitivity and require long exposure times even with high powered lasers. In addition, most of the photosensitive materials used in these elements have their greatest sensitivity in the ultraviolet range. While UV lasers are known, economical and reliable UV lasers with high power are generally not available. Although it may be possible to develop photosensitive compositions which are sensitive in the infrared region where lasers are readily available, this would require a great deal of experimentation in order to achieve materials which have the other necessary properties of the relief.

SUMMARY OF THE INVENTION

The present invention relates to a process for preparing a relief image, which comprises:

(1) preparing an element having the following layers: (a) a support; (b) a photosensitive layer comprising an initiator having sensitivity to non-infrared actinic radiation; (c) at least one infrared radiation sensitive layer which is substantially opaque to actinic radiation; and (d) a coversheet;

(2) exposing imagewise the element though layer (d) with infrared laser radiation;

(3) removing the layer (d) having adhered thereto a part of layer (c), wherein the remaining element consists of layers (a), (b) and a mask consisting of the part of layer (c) not adhered to layer (d);

(4) exposing overall the remaining element of step (3) with actinic radiation through the mask; and (5) developing the product of step (4).

In a second embodiment, the invention relates to a photosensitive element used for preparing a relief image comprising:

(a) a support, (b) a photosensitive layer comprising an initiator having sensitivity to non-infrared actinic radiation;

(c) at least one infrared radiation sensitive layer which is substantially opaque to actinic radiation; and (d) a coversheet which is removed after imagewise exposure to infrared laser radiation and, optionally, a barrier layer (b') interposed between layers (b) and (c).

DETAILED DESCRIPTION OF THE INVENTION

The process of this invention combines the convenience and sensitivity of infrared laser imaging using conventional photosensitive compositions including photohardenable compositions which are known to produce flexographic printing plates. Consequently, flexographic printing plates with known good printing characteristics can be produced quickly and economically by using digital imaging means.

Process

The process of this invention is performed in the following manner: First, an element is prepared having the following layers in the order specified: (a) a support; (b) a photosensitive layer comprising an initiator, having sensitivity to non-infrared actinic radiation; (c) at least one infrared radiation sensitive layer which is substantially opaque to actinic radiation; and (d) a coversheet.

The term "substantially opaque to actinic radiation" means that the amount of actinic radiation transmitted to the underlying photosensitive layer is so miniscule that no significant amount of photoinduced reaction occurs in the photosensitive layer.

Layer (c) is generally referred to as the "infrared-sensitive layer" and that term as used herein means a layer which comprises both infrared-sensitive material and actinic radiation opaque material or a single material which functions in both capacities. This layer can be referred to as an "infrared sensitive layer" or an "actinic radiation opaque layer" (radiation opaque layer). Although, this is generally referred to as a single layer, it will be understood that two or more layers can be used.

The element can be constructed as a single unit having an infrared-sensitive layer overlying a photosensitive layer. The individual layers can be prepared employing a variety of techniques which are well known to those skilled in the art. Such techniques include coating or spraying, molding, extrusion and calendering. The layers can be formed on the support sequentially or simultaneously.

Alternatively, the element can be constructed from two separate elements: (1) a conventional photosensitive element comprising a support, a photosensitive layer and a removable coversheet, and (2) an infrared-sensitive element comprising an infrared-sensitive layer and a removable coversheet by removing the coversheet of the photosensitive element (1) placing the two elements together such that the infrared-sensitive layer is next to the photosensitive layer. If a barrier layer is present on either the photosensitive layer or the infrared-sensitive layer, the two elements are placed together such that the barrier layer is interposed between the photosensitive layer and the infrared-sensitive layer. The two elements can be simply placed together or they can be laminated. Only moderate temperatures should be used during lamination.

Elements having a photohardenable layer are well suited for use as the photosensitive element (1). In particular, conventional, commercially available flexographic printing elements can be used. The release layer on the flexographic printing element can also function as a barrier layer. This is discussed in greater detail below.

The infrared-sensitive layer in the element is interposed between the coversheet and the photosensitive layer which is sensitive to non-infrared actinic radiation, or between the coversheet and the barrier layer. The infrared-sensitive layer has an adhesion balance between the coversheet and the photosensitive layer or barrier layer such that it adheres more strongly to one of the layers. The difference in adhesion should be sufficiently great so that if the coversheet were removed prior to exposure to infrared laser radiation, i.e., peeled off, the entire infrared-sensitive layer would remain affixed to either the coversheet or to the photosensitive or barrier layer. The infrared-sensitive materials which can be used in the process of the invention are those for which the adhesion balance is reversed when the material is exposed to infrared laser radiation. Thus, after exposure to infrared laser radiation the infrared-sensitive layer adheres more strongly to the layer to which it had lower adhesion prior to the exposure. In most cases, the infrared-sensitive layer has greater adhesion to the coversheet before exposure to infrared laser radiation and has greater adhesion to the photosensitive layer (or barrier layer if present) after exposure to that radiation. Thus, when the coversheet is removed, substantially all of those areas of the infrared-sensitive layer which have been exposed will adhere to the photosensitive layer (or barrier layer if present) and substantially all of those areas of the infrared-sensitive layer which have not been exposed adhere to the coversheet and are removed with it. With some infrared-sensitive materials this pattern is reversed, i.e., when the coversheet is removed, those areas of the infrared-sensitive layer which have not been exposed adhere to the photosensitive layer (or barrier layer if present) and those areas of the infrared-sensitive layer which have been exposed adhere to the coversheet and are removed with it.

The second step in the process of the invention is to imagewise expose the element to infrared laser radiation through the cover sheet. The exposure can be carried out using various types of infrared lasers. Diode lasers emitting in the region of 750 to 880 nm offer substantial advantage in terms of their small size, low cost, stability, reliability, ruggedness and ease of modulation. Diode lasers emitting in the range of 780 to 850 nm may be used to advantage. Such lasers are commercially available from, for example, Spectra Diode Laboratories, San Jose, Calif. Other IR lasers include solid state lasers, e.g., Nd:YAG lasers emitting at 1060 nm which are very useful.

The third step in the process of the invention is to remove the coversheet having adhered thereto a part of the infrared radiation sensitive layer which is substantially opaque to actinic radiation (layer c), wherein the remaining element consists of layers (a), (b) and the part of layer (c) not adhered to layer (d) to create an actinic radiation opaque mask on the photosensitive layer, or barrier layer if one is present.

The fourth step in the process of the invention is to overall expose the remaining element with actinic radiation through the mask. The type of radiation used is dependent on the type of photoinitiator in the photosensitive layer. The actinic radiation-opaque material in the remaining infrared-sensitive layer on the photosensitive layer prevents the material beneath from being exposed to the actinic laser radiation. For photohardenable systems, those areas covered by the actinic radiation-opaque mask do not polymerize or crosslink. The areas not covered by the actinic radiation-opaque mask are exposed to actinic radiation and photoharden. Most photoinitiators are sensitive to visible or UV radiation. Examples of suitable visible or UV sources include carbon arcs, mercury-vapor arcs, fluorescent lamps, electron flash units electron beam units and photographic flood lamps. The most suitable sources of UV radiation are the mercury-vapor lamps, particularly the sun lamps. A standard radiation source is the Sylvania 350 Blacklight fluorescent lamp (FR 48T12/350 VL/VHO/180, 115 w) which has a central wavelength of emission around 354 nm.

It is contemplated that the imagewise exposure to infrared radiation and the overall exposure to actinic radiation can be carried out in the same equipment. It is preferred that this be done using a drum-i.e., the photosensitive element is mounted on a drum which is rotated to allow for exposure of different areas of the element.

For photohardenable systems, it is preferred that this exposure step be carried out in the absence of oxygen. The photohardening reactions will take place when oxygen is present, but they require longer exposure times and the results are less reproducible. The element can be placed in a vacuum frame for the exposure step. If the surface of the photohardenable layer is tacky some type of releasable covering should be put over the layer to prevent it from sticking to the cover in the vacuum frame. Exposure can also be carried out in an inert atmosphere, e.g., nitrogen, or with the surface being swept with an inert atmosphere.

If a barrier layer is present, it will effectively prevent the interaction of oxygen with the photohardenable layer and, thus, the exposure step can be carried out in the presence of atmospheric oxygen.

The actinic radiation exposure time can vary from a few seconds to minutes, depending upon the intensity and spectral energy distribution of the radiation, its distance from the photosensitive element, and the nature and amount of the photosensitive composition. Typically for the photohardenable elements discussed below, a mercury vapor arc or a sunlamp is used at a distance of about 1.5 to about 60 inches (3.8 to 153 cm) from the element. Exposure temperatures are preferably ambient or slightly higher, i.e., about 20° to about 35° C.

Following overall exposure to UV radiation through the mask formed by the actinic radiation-opaque material, the image is developed to form a relief. The development step is based on the differences in physical properties between the areas of the photosensitive layer which have been exposed to actinic radiation, and those areas which have not been exposed. Development may involve, e.g., washing out the more soluble portions of the photosensitive layer, or transfer of areas of the photosensitive layer to another substrate. When systems are used in which exposure to actinic radiation results in differences in solubility, development is accomplished by washing with a suitable developer solvent. Development is usually carried out at about room temperature. The developers can be organic solvents, aqueous or semi-aqueous solutions. The choice of the developer will depend on the chemical nature of the photosensitive material to be removed.

Additional process steps will be discussed below in conjunction with specific photosensitive elements.

Element

A photosensitive element which is particularly suited for the process of the invention comprises:

(a) a support;

(b) a photosensitive layer comprising an initiator having sensitivity to non-infrared actinic radiation;

(c) at least one infrared radiation sensitive layer which is substantially opaque to actinic radiation, and (d) a coversheet which is removed after imagewise exposure to infrared laser radiation.

The infrared-sensitive layer (layer c) should be capable of absorbing infrared laser radiation, and should be opaque to actinic radiation as described above. This can be accomplished using a single material or combination of materials. Also, a binder can be present if desired. The properties of the infrared-sensitive layer can be modified by using other ingredients, such as, for example, plasticizers, pigment dispersants, adhesion modifiers, surfactants, and coating aids, provided that they do not adversely affect the imaging properties of the element.

The infrared-absorbing material should have a strong absorption in the region of the imaging radiation, typically 750 to 20,000 nm. Examples of suitable infrared-absorbing materials which can be used alone or in combination include dyes, such as poly(substituted)phthalocyanine compounds; cyanine dyes; squarylium dyes; chalcogenopyryloarylidene dyes; bis(chalcogenopyrylo)polymethine dyes; oxyindolizine dyes; bis(aminoaryl)polymethine dyes; merocyanine dyes; croconium dyes; metal thiolate dyes; and quinoid dyes. Also suitable are pigments which can be used alone or in combination, including carbon black, graphite, copper chromite, chromium oxides, cobalt chrome aluminate, and other dark inorganic pigments. The inorganic pigments, generally function as both infrared-absorbing material and radiation-opaque material.

The infrared-absorbing materials can be present in any concentration which is effective for the intended purpose. In general, for the organic compounds, concentrations of 0.1 to 80% by weight, based on the total weight of the layer, have been found to be effective.

Any material which prevents the transmission of actinic light to the photosensitive layer can be used as the actinic radiation-opaque material. Examples of suitable actinic materials include dyes and pigments, particularly the inorganic pigments discussed above. As most initiators which are used in the photosensitive layer are sensitive to actinic radiation in the ultraviolet region, it is often convenient to use carbon black to provide UV and visible opacity. When carbon black is used it is not necessary to use an additional infrared-sensitive material.

The concentration of the actinic radiation-opaque material is chosen so as to achieve the desired optical density, i.e., so that the layer prevents the transmission of actinic radiation to the photosensitive layer. The concentration of radiation-opaque material which is needed, decreases with increasing thickness of the layer. In general a concentration of 1–80% by weight, based on the total weight of the layer can be used. It is preferred to use 2–70% by weight, based on the total weight of the layers.

The binder for the infrared-sensitive layer is a polymeric material in which the other materials in the infrared-sensitive layer can be uniformly dispersed. The binder should also be capable of forming a uniform coating on the photosensitive layer or barrier layer. Examples of organic binders which can be used include polymers such as ethylcellulose, nitrocellulose, polyacrylic acids and the metal alkali salts thereof; homopolymers and copolymers (i.e., polymers of two or more monomers) of acrylates, methacrylates, and styrene; polyvinyl alcohol, polyvinyl chloride, and polyacrylonitrile; amphoteric interpolymers; and mixtures thereof.

The thickness of infrared-sensitive layer should be in a range to optimize both sensitivity and opacity. The layer should be thin enough to provide good sensitivity, i.e., the change in adhesion balance should occur rapidly upon exposure to infrared laser radiation. At the same time, the layer should be thick enough so that the areas of the layer which remain on the photosensitive layer (or barrier layer, if present) after imagewise exposure effectively mask the photosensitive layer from actinic radiation. In general, this layer will have a thickness from about 20 Angstroms to about 50 micrometers. It is preferred that the thickness be from 40 Angstroms to 40 micrometers.

In most cases the infrared-sensitive layer adheres more strongly to the coversheet prior to exposure to infrared laser radiation and adheres more strongly to the photosensitive layer (or barrier layer if present) after exposure. Such materials are commercially available, e.g., LaserMask™ from James River Graphics, Inc. It is also possible to use materials in the reverse mode, i.e., ones in which the adhesion of the infrared-sensitive material to the coversheet increases upon exposure to infrared radiation and the non-exposed areas remain on the photosensitive layer (or barrier layer) when the coversheet is removed.

Additional layers can be present in the element to control the adhesion of the actinic radiation opaque layer.

The coversheet should provide the proper adhesion balance with the infrared-sensitive layer as discussed above. Generally, the coversheet is a dimensionally stable polymeric film. The film should be transparent to infrared radiation since the infrared-sensitive layer is imaged through the coversheet. The coversheet is generally a thin transparent film of polyester, polycarbonate, polyamide, fluoropolymers, polystyrene, polyethylene, polypropylene, or other strippable material. A preferred coversheet is polyethylene terephthalate. The coversheet typically has a thickness from 0.1 to 10 mils (0.00025 to 0.025 cm), with a preferred thickness of 0.5 to 5 mils (0.0013 to 0.013 cm).

It is frequently desirable to have at least one barrier layer, (b') interposed between the photosensitive layer and the infrared-sensitive layer. The photosensitive layers can be inherently tacky, especially the photohardenable layers used to make flexographic printing plates. The barrier layer can be helpful in achieving the correct adhesion balance. In addition, the barrier layer prevents the migration of monomer, if present, from the photosensitive layer to the infrared-sensitive layer. If the monomer is compatible with the materials used in the infrared-sensitive layer and migratory, monomer migration will occur with time and can drastically alter the adhesion balance. If the monomer is substantially incompatible with the infrared-sensitive layer or substantially non-migratory there will be no migration. But if there is even marginal compatibility, migration will occur. When the element is not imaged and developed immediately after it is put together, it is preferred that a barrier layer be present.

The barrier layer should be transparent to actinic radiation so that when the element is exposed to actinic radiation through the infrared-sensitive layer, the radiation passes through the barrier layer to the underlying photosensitive layer without significant diminution in intensity.

The barrier layer should also be removable prior to or during the development step, at least in those areas corresponding to the areas of the photosensitive layer which are removed to form the relief. This can be accomplished by using a strippable barrier layer and simply peeling it off after the actinic radiation exposure step. Or, when the development step is a washout step, the barrier layer can be soluble, swellable, dispersible or liftable in developer solutions, at least in those areas not exposed to actinic radiation, during processing of the exposed element. Examples of materials which are suitable for use as the barrier layer and are completely removed in developer solvents include polyamides, polyvinyl alcohol, hydroxyalkyl cellulose, copolymers of ethylene and vinyl acetate, amphoteric interpolymers, and combinations thereof. The strippable barrier layer can be a thin film, e.g., polyester.

Another type of barrier layer which can be used when the photosensitive layer is developed by a washout process, is a photosensitive layer. This type of barrier layer will have the same kind of photosensitivity as the underlying photosensitive layer, i.e., both should be photosolubilizable or both should be photohardenable. Thus, when this type of barrier layer is used, it is removed by the developer solvent in the same areas where the underlying photosensitive layer is removed, and remains on the surface in the areas where the underlying layer remains.

When the underlying layer is photohardenable, the barrier layer can be photosensitive itself, i.e., contain monomer and initiator, or it can become photosensitive when in contact with the hardenable layer.

Another type of barrier layer which can be used with the elastomeric photohardenable materials discussed below, is a layer of an elastomeric composition. The composition can consist simply of a nonphotosensitive elastomeric binder layer similar to the binder in the photohardenable layer. A preferred barrier layer is an elastomeric composition comprising an elastomeric polymeric binder, a second polymeric binder and optionally a nonmigratory dye or pigment. The elastomeric polymeric binder in the elastomeric composition is generally the same as or similar to the elastomeric binder present in the photopolymer layer.

It is also possible to use more than one barrier layer. For example, an elastomeric barrier layer can be present next to the photohardenable layer and this, in turn, can be overcoated with a barrier layer which is soluble both before and after exposure to actinic radiation. The exact choice of barrier layer(s) will depend on the nature of the photopolymerizable layer and the infrared-sensitive layer and other physical requirements of the photosensitive element.

The support can be any material which is conventionally used with photosensitive elements and, in particular, those used to prepare flexographic printing plates. Examples of suitable support materials include polymeric films such those formed by addition polymers and linear condensation polymers, translucent foams and fabrics. A preferred support polyester film; particularly preferred is polyethylene terephthalate. The support typically has a thickness from 2 to 10 mils (0.0051 to 0.025 cm), with a preferred thickness of 3 to 8 mils (0.0076 to 0.020 cm). In addition, the support can be subbed or surface treated to improve adhesion.

The photosensitive layer generally comprises a photoinitiator, which is sensitive to non-infrared actinic radiation, and a component that is capable of reacting with the initiator, after it has been activated by exposure to actinic radiation. The interaction of the initiator and the component produces a change in the physical properties of the layer. The areas of the photosensitive layer which have been exposed to actinic radiation are differentiated from the areas which have not been exposed based on the photoinduced difference in the physical properties of the exposed and nonexposed areas. The types of physical property changes in photosensitive layers that can be used to advantage in the process of the invention include changes in solubility, swellability or dispersability, changes in softening point, changes in tackiness, changes in permeability for processing solution, and the like.

Of interest, particularly for the formation of relief images, are those systems in which exposure to actinic radiation effects a change in solubility in the photosensitive layer. As used herein, the term "solubility" is intended to mean the ability to be removed by the action of a developer liquid and is intended to encompass swellability and dispersability, as well as complete solubility. The change in solubility can be an increase due to a photosolubilization reaction, or a decrease due to a photohardening reaction, either photocrosslinking or photopolymerization. Photosolubilization generally occurs by the reaction of a preformed polymer with either pendant reactive groups or other molecules to increase the solubility (or the rate of solubilization) of the photosensitive material. Photocrosslinking generally occurs by the crosslinking of a preformed polymer to form a less soluble crosslinked polymeric network. This can take place either through dimerization of pendant reactive groups attached directly to the polymer chain, or reaction of the polymer with a separate polyfunctional photoactive crosslinking agent. Photopolymerization generally occurs when relatively low molecular weight monomers or oligomers undergo photoinitiated cationic or free radical polymerization to form less soluble polymers.

It is preferred to use photohardenable materials as the photosensitive layer in the process of the invention. Photohardenable materials can be photocrosslinkable, photopolymerizable, or combinations of both. Photohardenable materials generally comprise a binder, a photoinitiator or photoinitiator system (hereinafter referred to as "photoinitiator system") and one of (i) a low molecular weight monomer or oligomer capable of undergoing polymerization, (ii) reactive groups pendant to the binder which are capable of reacting with each other or (iii) reactive groups pendant to the binder and a crosslinking agent capable of reacting with the reactive groups.

Materials which can be used as the binder include polymers and copolymers of acrylates, methacrylates, acrylamides, styrene, vinyl acetate and its partially hydrogenated derivatives, including amphoteric interpolymers. Also gelatin and cellulose esters and ethers, and elastomeric materials, such as polymers and copolymers of butadiene and isoprene can be used. The photoinitiator system is one which, upon irradiation with actinic radiation, forms a species which will initiate either free radical or cationic crosslinking or polymerization reactions. By actinic radiation, it is meant high energy radiation including but not limited to UV, visible, electron beam, and X-ray. Most photoinitiator systems for free radical reactions in current use are based upon one of two mechanisms: photofragmentation and photoinduced hydrogen abstraction. Suitable photoinitiator systems of the first type include peroxides, such as benzoyl peroxide; azo compounds, such as 2,2'-azobis(butyronitrile); benzoin derivatives, such as benzoin and benzoin methyl ether; derivatives of acetophenone, such as 2,2-dimethoxy-2-phenylacetophenone; ketoxime esters of benzoin; triazines; and biimidazoles. Suitable photoinitiator systems of the second type include anthraquinone and a hydrogen donor; benzophenone and tertiary amines; Michler's ketone alone and with benzophenone; thioxanthones; and 3-ketocoumarins.

Photoinitiator systems suitable for cationic crosslinking or polymerization reactions are those which, upon irradiation, produce a Lewis acid or a protonic Bronsted acid which is capable of initiating polymerization of ethylene oxide or epoxy derivatives. Most photoinitiator systems of this type are onium salts, such as diazonium, iodonium and sulfonium salts.

Sensitizing agents can also be included with the photoinitiator systems discussed above. In general, sensitizing agents are those materials which absorb radiation at a wavelength different than that of the reaction-initiating component, and are capable of transferring the absorbed energy to that component. Thus, the wavelength of the activating radiation can be adjusted.

As mentioned above, the binder can have pendant groups which are capable of undergoing free-radical induced or cationic crosslinking reactions. Pendant groups which are capable of undergoing free-radical induced crosslinking reactions are generally those which contain sites of ethylenic unsaturation, such as mono- and polyunsaturated alkyl groups; acrylic and methacrylic acids and esters. In some cases, the pendant crosslinking group can itself be photosensitive, as is the case with pendant cinnamoyl or N-alkyl stilbazolium groups. Pendant groups which are capable of undergoing cationic crosslinking reactions include substituted and unsubstituted epoxide and aziridine groups.

Monomers undergoing free-radical polymerization are typically ethylenically unsaturated compounds. Examples of which include acrylate and methacrylate esters of alcohols and their low molecular weight oligomers. Examples of suitable monomers and oligomers with two or more sites of unsaturation capable of undergoing free-radical induced addition reactions, include the polyacrylate and polymethacrylate esters of polyols such as triethyleneglycol, trimethylolpropane, 1,6-hexanediol, and pentaerythritol, and their low molecular weight monomers. Esters of ethoxylated trimethyolol propane, in which each hydroxyl group has been reacted with several molecules of ethylene oxide, as well as monomers derived from bisphenol A diglycidyl ether and monomers derived from urethanes have also been used. Monomers which undergo cationic polymerization include mono- and polyfunctional epoxides and aziridines. In some cases, where there are residual reactive sites in the binder, e.g., residual unsaturation or epoxide groups, the crosslinking agent can also react with the binder.

Although, any of the above described photosensitive materials can be used in the process of the invention, photohardenable materials which are suitable for the preparation of flexographic printing plates are particularly preferred and are described in greater detail below.

The photohardenable material comprises an elastomeric binder, at least one monomer and an initiator system, where the initiator system has a sensitivity to actinic radiation having a wavelength range not in the infrared region. In most cases, the initiator will be sensitive to visible or ultraviolet radiation. Any photohardenable compositions which are suitable for the formation of flexographic printing plates can be used for the present invention. Examples of suitable compositions have been disclosed, for example, in Chen et al. U.S. Pat. No. 4,323,637, Gruetzmacher et al. U.S. Pat. No. 4,427,759 and Feinberg et al. U.S. Pat. No. 4,894,315.

The elastomeric binder can be single polymer or mixture of polymers which can be soluble or dispersible in aqueous, semi-aqueous or organic solvent developers. Binders which are soluble or dispersible in aqueous or semi-aqueous developers have been disclosed in Alles U.S. Pat. No. 3,458,311; Pohl U.S. Pat. No. 4,442,302; Pine U.S. Pat. No. 4,361,640; Inoue et al. U.S. Pat. No. 3,794,494; Proskow U.S. Pat. No. 4,177,074; Proskow U.S. Pat. No. 4,431,723; and Worns U.S. Pat. No. 4,517,279, the disclosures of which are hereby incorporated by reference. Binders which are soluble or dispersible in organic solvent developers include natural or synthetic polymers of conjugated diolefin hydrocarbons, including polyisoprene, 1,2-polybutadiene, 1,4-polybutadiene, butadiene/acrylonitrile, butadiene/styrene thermoplastic-elastomeric block copolymers and other copolymers. The block copolymers discussed in Chen U.S. Pat. No. 4,323,636; Heinz et al. U.S. Pat. No. 4,430,417; and Toda et al. U.S. Pat. No. 4,045,231, the disclosures of which are hereby incorporated by reference, can be used. It is preferred that the binder be present in at least an amount of 50% by weight of the photohardenable layer.

The term binder, as used herein, encompasses core shell microgels and blends of microgels and preformed macromolecular polymers, such as those disclosed in Fryd et al. U.S. Pat. No. 4,956,252, the disclosure of which is hereby incorporated by reference.

The photohardenable layer can contain a single monomer or mixture of monomers which should be compatible with the binder to the extent that a clear, non-cloudy photosensitive layer is produced. Monomers that can be used in the photohardenable layer are well known in the art. Examples of such monomers can be found in Chen U.S. Pat. No. 4,323,636; Fryd et al. U.S. Pat. No. 4,753,865; Fryd et al. U.S. Pat. No. 4,726,877; and Feinberg et al U.S. Pat. No. 4,894,315, the disclosures of which are hereby incorporated by reference. It is preferred that the monomer be present in at least an amount of 5% by weight of the photohardenable layer.

The photoinitiator system can be any single compound or group of compounds which is sensitive to radiation other than infrared radiation, generating free radicals which initiate the polymerization of the monomer or monomers without excessive termination. The photoinitiator is generally sensitive to visible or ultraviolet radiation, preferably ultraviolet radiation. It should be thermally inactive at and below 185° C. Examples of suitable photoinitiators include the substituted and unsubstituted polynuclear quinones. Examples of suitable systems have been disclosed in Gruetzmacher et al. U.S. Pat. No. 4,460,675 and Feinberg et al. U.S. Pat. No. 4,894,315, the disclosures of which are hereby incorporated by reference. Photoinitiators are generally present in amounts from 0.001% to 10.0% based on the weight of the photohardenable composition.

The photohardenable layer can contain other additives depending on the final properties desired. Such additives include thermal polymerization inhibitors, sensitizers, plasticizers, colorants, antioxidants, antiozonants, fillers or reinforcing agents.

The barrier layers which can be used with these photohardenable layers are the same as discussed above. A preferred barrier layer is a layer of an elastomeric composition which is photosensitive or becomes photosensitive when in contact with the underlying photohardenable layer. Suitable compositions for this type of barrier layer are those disclosed in Grüetzmacher et al., U.S. Pat. Nos. 4,427,759 and 4,460,675, the disclosures of which are hereby incorporated by reference.

The photohardenable layer can be prepared in many ways be admixing the binder, monomer, initiator, and other ingredients. It is preferred that the photohardenable mixture be formed into a hot melt and then calendered to the desired thickness. An extruder can be used to perform the functions of melting, mixing, deaerating and filtering the composition. The extruded mixture is then calendered between the support and a temporary, removable coversheet. The temporary coversheet is generally previously coated with barrier layer. The adhesion between the barrier layer and the temporary coversheet must be low, so that the barrier layer will remain intact on the photohardenable layer when the temporary coversheet is removed. Alternatively, the photohardenable material can be placed between the support and the barrier layer coated temporary coversheet in a mold. The layers of material are then pressed flat by the application of heat and/or pressure.

The infrared-sensitive layer is generally prepared by coating the infrared-sensitive material onto the coversheet. This element may also have a second, temporary coversheet on the other side of the infrared-sensitive layer to protect it during storage and handling. The adhesion of this temporary coversheet should be low and the sheet easily removed.

The final element is prepared by removing the temporary coversheet from the barrier layer on the photohardenable layer and, if present, from the infrared-sensitive layer. The two separate elements are then placed together such that the infrared-sensitive layer is adjacent to the barrier layer on the photohardenable layer. This complete element is then pressed together with moderate pressure.

Alternatively the barrier layer can be coated onto the infrared-sensitive layer initially, optionally followed by a temporary coversheet. This can be done sequentially or in a dual coating process. The photohardenable layer is prepared on the support, as described above, also with a temporary coversheet. The final element is prepared by removing the two temporary coversheets and placing the two separate elements together such that the barrier layer is between the photohardenable layer and the infrared-sensitive layer. This complete element is then pressed together with moderate pressure.

It is particularly advantageous to make the photosensitive element in the form of a continuous printing element. The flat sheet photosensitive element, i.e., the support, photosensitive layer and barrier layer, can be reprocessed by wrapping the element around a cylindrical form, usually a printing sleeve or the printing cylinder itself, and fusing the edges of the photosensitive layer together to form a seamless, continuous element. The infrared sensitive coating on a coversheet can then be wrapped around the continuous photosensitive element, such that the infrared sensitive layer is adjacent to the barrier layer. The infrared sensitive layer can also be made in sleeve form, and slipped over the continuous photosensitive element. In a preferred method, the photopolymerizable layer is wrapped around the cylindrical form and the edges joined. One process for joining the edges has been disclosed in German patent DE 28 44 426. The photopolymerizable layer can then be spray coated with at least one barrier layer. The coversheet coated with the infrared-sensitive layer is then wrapped around the element such that the infrared-sensitive layer is adjacent to the barrier layer. The element is then imagewise exposed to infrared laser radiation, the coversheet is removed, and the continuous element is exposed to actinic radiation and developed.

Continuous printing elements have applications in the flexographic printing of continuous designs such as in wallpaper, decoration and gift wrapping paper. Furthermore, such continuous printing elements are well-suited for mounting on conventional laser equipment. The sleeve or cylinder on which the printing element is wrapped when the edges are fused, can be mounted directly into the laser apparatus where it functions as the rotating drum during the laser exposure step.

Unless otherwise indicated, the term "flexographic printing plate or element" encompasses plates or elements in any form suitable for flexographic printing, including, but not limited to, flat sheets and seamless continuous forms.

As discussed above, to prepare a flexographic printing plate, the printing elements are first imagewise exposed to infrared laser radiation through the coversheet. The coversheet is removed and an actinic radiation opaque mask adheres to the photohardenable layer (or barrier layer) in a pattern. The element is exposed overall to UV radiation and then developed to remove the unexposed areas of the photohardenable layer, i.e., those areas which have not been photohardened. If a barrier layer is present, it is removed in at least the unexposed areas.

Developers which can be used with the photohardenable elements which are used to prepare flexographic printing plates include organic solvent developers, aqueous and semi-aqueous solutions. Suitable organic solvent developers include aromatic or aliphatic hydrocarbon and aliphatic or aromatic halohydrocarbon solvents, or mixtures of such solvents with suitable alcohols. Other organic solvent developers have been disclosed in published German Application 38 28 551. Suitable semi-aqueous developers usually contain water and a water miscible organic solvent and an alkaline material. Suitable aqueous developers contain water and an alkaline material. Other suitable aqueous developer combinations are described in U.S. Pat. No. 3,796,602.

Development time can vary, but it is preferably in the range of about 2 to 25 minutes. Developer can be applied in any convenient manner, including immersion, spraying and brush or roller application. Brushing aids can be used to remove the unpolymerized portions of the composition. For photohardenable systems, washout is frequently carried out in an automatic processing unit which uses developer and mechanical brushing action to remove the unexposed portions of the plate, leaving a relief constituting the exposed image and the floor.

Following development, the relief printing plates are generally blotted or wiped dry, and then dried in a forced air or infrared oven. Drying times and temperatures may vary, however, typically the flexographic plate is dried for 60 to 120 minutes at 60° C. High temperatures are not recommended because the support can shrink and this can cause registration problems.

Additional process steps can be carried out in the preparation of flexographic printing plates from elastomeric photohardenable elements.

One additional step is to give the element a blanket exposure to actinic radiation through the support. This exposure, generally called a backflash exposure, is used to create a shallow layer of photohardened material, or a floor, on the support side of the photohardenable layer and to sensitize the photohardenable layer. The floor provides improved adhesion between the photohardenable layer and the support and also established the depth of the plate relief. This backflash exposure can take place before, after or during the other imaging steps. It is preferred that this step take place immediately prior to the exposure step through the radiation opaque mask. Any conventional sources of actinic radiation can be used for this exposure step. Exposure times for the backflash generally range from a few seconds up to about a minute.

Most flexographic printing plates are uniformly post-exposed to ensure that the photopolymerization or photocrosslinking process is complete and that the plate will remain stable during printing and storage. This post-exposure step utilizes the same radiation source as the main exposure.

Detackification is an optional post-development treatment which can be applied if the surface is still tacky, such tackiness not generally being removed in post-exposure. Tackiness can be eliminated by methods well known in the art, such as treatment with bromine or chlorine solutions. Such treatments have been disclosed in, for example, U.S. Pat. Nos. 4,400,459, 4,400,460 and German Patent 28 23 300, the disclosures of which are hereby incorporated by reference. Detackification can also be accomplished by exposure to radiation sources having a wavelength not longer than 300 nm, as disclosed in European Published Patent Application 0 017927 and Gibson U.S. Pat. No. 4,806,506.

All references/publications mentioned herein are hereby incorporated by reference unless indicated otherwise.

EXAMPLES

Example 1

This example illustrates the process of the invention using an infrared-sensitive film, where the IR-exposed areas adhere to the barrier layer.

A Cyrel® 30CP (E. I. du Pont de Nemours and Company, Wilmington, Del.) flexographic printing element was placed on the drum of a Crosfield 645 scanner. The temporary coversheet was removed leaving a polyamide release layer as the outer surface. The polyamide layer functioned as the barrier layer. A sheet of IR sensitive UV-opaque film (Laser-Mask™ made by James River Graphics, Inc., South Hadley, Mass.) was placed on top of the Cyrel® flexographic printing element on the drum assisted with a roller available on the unit. The infrared sensitive layer was placed next to the release layer of the Cyrel® element. The Crosfield 645 scanner had been modified with an IR diode laser head having 780 to 840 nm output as described in Kellogg et al., *Journal of Imaging Science and Technology,* Vol. 36, No. 3, pages 220–274 (May–June 1992). The mounted element was given an imagewise exposure through the coversheet side of the IR film using signals sent from the Crosfield 645 reader. A halftone image was used (150 lines per inch screen) and the exposure energy was 600 mj/cm$^2$. The coversheet was then removed from the element with low release force. Black, UV-opaque mask with excellent dot resolution adhered to the polyamide layer of the photosensitive plate in the areas which had been exposed to the laser. In the areas which had not been exposed to the IR laser, the black layer remained with the coversheet. To ensure good UV mask density on the plate, the exposure was repeated in register with a second sheet of IR sensitive film. The element was then removed from the drum and given a back flash exposure for 30 seconds through the support and a top exposure from the mask side of 120 seconds in a Cyrel® 30×40 exposure unit. The exposed element was developed with a 3:1 mixture (vol/vol) of Perclene and butanol in a Cyrel® processor. The black mask and polyamide layer dissolved in the developer and the unexposed areas were removed as expected. After drying in the 60° C. oven for 15 minutes, the developed plate was simultaneously light finished and post exposed in a Cyrel® light finishing unit. Excellent image resolution was obtained.

Example 2

This example illustrates the process of the invention using two barrier layers: an elastomeric barrier layer with a second, solvent soluble barrier layer on top.

A flexographic photosensitive element comprising a flame-treated polyester support, photohardenable layer, elastomeric layer (first barrier layer), polyamide layer (second, solvent soluble barrier layer) and polyester coversheet (temporary coverlayer) was prepared as described in Example 4 of Applicants' assignee's copending application having U.S. Ser. No. 07/576,986, filed Sep. 5, 1990. The photosensitive element was placed on the drum of a Crosfield 645 scanner using double sided tape. The temporary cover layer was removed. A sheet of the IR sensitive film used in Example 1 was placed over the photosensitive element such that the IR sensitive layer was adjacent to the second barrier layer. This was done with a roller available on the scanner machine. The scanner had been modified with an IR diode laser head having 780 to 840 nm output, as described in Example 1.

The mounted element was given an imagewise exposure through the coversheet of the IR film as described in Example 1. The coversheet was then removed. The procedure was repeated with two addition IR sensitive films for a total of three infrared imagewise exposures in register. The element was then exposed to UV radiation and developed as described in Example 1, using a backflash exposure of 50 seconds, a top exposure of 720 seconds, a development time of 5.5 minutes, an oven drying time of two hours and a post exposure and light finishing time of 10 minutes. The second, polyamide barrier layer was removed completely in the development step. The elastomeric barrier layer was removed only in the areas which were not exposed to UV radiation. The elastomeric barrier layer remained on the top of the photohardened material in the areas exposed to UV radiation.

Excellent image resolution was obtained.

Example 3

This example illustrates the formation of an element having an elastomeric barrier layer.

A flexographic photosensitive element comprising a flame-treated polyester support, photohardenable layer, elastomeric layer, polyamide layer and polyester coversheet (temporary coversheet) was prepared as described in Example 2 above. The photosensitive element was placed on the drum of a Crosfield 645 scanner using double sided tape. The cover layer and the polamide layer were removed by putting tape on the leading edge and peeling it off. Thus, the photohardenable layer was overcoated with a single, elastomeric barrier layer. A sheet of the IR sensitive film used in Example 1 was placed over the photosensitive element with a roller available on the scanner machine. The IR sensitive layer was placed next to the elastomeric barrier layer. The scanner had been modified with an IR diode laser head having 780 to 840 nm output as described above.

The mounted element was given an imagewise exposure through the coversheet of the IR film as described in Example 1. The coversheet was then removed by peeling it off at a 180° angle with low release force at a slow rate. A good mask image on the element was obtained. This element can then be exposed to UV radiation and developed as described above.

Example 4

This examples illustrates the use of different barrier layers in the transfer of UV-opaque material using IR laser exposure.

A 5-mil (0.013 cm) thick sheet of polyethylene terephthalate film was coated with barrier layers A–C at the coating weights listed below:

| Sample | Barrier Layer | Weight[a] |
|---|---|---|
| 4A | Hydroxypropyl Cellulose | 27.9 |
| 4B | Polyamide[b] | 40.0 |
| 4C | 85% Polyamide[b]/15% Amphoteric Interpolymer[c] | 47.0 |

[a]in mg/dm$^2$
[b]Macromelt 6900 from Henkel Corp. (Minneapolis, MN)
[c]40% N-t-octylacrylamide, 34% methyl methacrylate, 16% acrylic acid, 6% hydroxypropyl methacrylate, and 4% t-butyl amino ethyl methacrylate Each of the coated samples were mounted and exposed to IR radiation as described in Example 1. In each case the UV opaque material transferred to the barrier layer in the IR laser exposed areas.

Example 5

This example illustrates the use of the process of the invention using an aqueous developable flexographic photosensitive element.

A photohardenable composition is prepared by charging a 950 ml amber bottle with the following ingredients in the order listed:

| Ingredient | Amount (g) |
|---|---|
| Methylene chloride | 276 |
| Methanol | 24 |
| Trimethylolpropane ethoxy triacrylate | 25 |
| 2,2-Dimethoxy-2-phenylacetophenone | 4 |
| Core/shell microgel binder[a] | 71 |

[a]The core/shell microgel has an elastomeric core of 2-ethylhexyl acrylate (98%), 1,4-butanediol diacrylate (1%), and allyl methacrylate (1%); an elastomeric shell of n-butyl acrylate (80%) and methacrylic acid (20%); and a core/shell ratio of 2:1.

The bottle is placed on a roller mill for 16 hours where the mixture turns into a clear, gelatinous mass. To this is added 1 ml of a solution containing 1 g C.I. Basic Green 4 (C.I. #42000) in 100 ml methanol.

The mixture is charged to a rubber mill at 100° C. to flash the solvent mixture, followed by milling for 15 minutes at 100° C. The photopolymer is rubbery.

A plate is prepared by pressing 30 grams of photopolymer between a support and coversheet using a Carver Laboratory Press, Model 2000-129 (Fred S. Carver, Inc., Summit, N.J.). The support is 8.5 mil (0.022 cm) Cronar® polyester film, coated with an adhesive layer containing a yellow antihalation dye. The adhesive layer contains 33.26 parts polyvinylidene chloride, 0.317 parts polymethylmethacrylate beads, 1.51 parts oxanol yellow dye and 0.053 parts surfactant. The coversheet is 5 mil (0.013 cm) Mylar® polyester film coated with polyvinyl alcohol at 40 mg/dm$^2$. The press cycle is equilibration at 150° C. followed by 2 minutes at 5000 psi and 1 minute at 10,000 psi.

The photosensitive flexographic element is mounted and exposed as described in Example 1. The imaged plate is developed with 0.5% aqueous sodium hydroxide solution for 5 minutes at 140° F. (60° C.) in a Cyrel® Aqueous Processor (E. I. du Pont de Nemours and Company, Wilmington, Del.), then dried for 1 hour at 140° F. (60° C.).

Example 6

This example illustrates the process of the invention using a different infrared sensitive film with adhesive layer and a strippable barrier layer.

An infrared sensitive film is first prepared. A coating solution is made up of the following ingredients:

| Ingredient | Amount[a] |
|---|---|
| Carbon black pigment | 0.32 |
| RCH-28808 Dispersant | 0.13 |
| Bisphenol A polycarbonate (MW = 21,000 to 25,000) | 0.05 |
| Dichloromethane | 9.5 |

[a]parts by weight

This is stirred with steel beads to completely disperse the pigment and dissolve the polymer. After stirring the composition is coated on a 0.5 mil (0.0013 cm) thick clear polyethylene terephthalate film (strippable barrier layer) using a doctor knife with a 50 micron wet gap, and air dried to form the active layer. A topcoat layer is coated onto the dried active layer from a coating solution containing 0.5 parts by weight bisphenol A polycarbonate and 9.5 parts by weight dichloromethane. The topcoat layer is coated with a doctor knife to produce a dried layer about 1 micrometer thick. After drying, a layer of transparent Scotch book tape (3M product 845, 3M Company, St. Paul, Minn.) is applied to the topcoat layer. The adhesive layer in the tape is 2-octyl acrylate with a small amount (less than 5%) aromatic plasticizer. The overall structure of the IR sensitive element is: PET (strippable barrier layer), IR-sensitive layer, a top coat layer, Scotch tape adhesive layer, and a Scotch tape backing layer.

The infrared sensitive element is placed on top of a Cyrel® 30CP flexographic printing element, from which both coversheet and release layer have been removed, such that the transparent PET strippable barrier layer of the infrared sensitive element is next to the photosensitive layer of the Cyrel® printing element. The imagewise infrared exposure is carried out through Scotch tape backing layer using the scanner described in Example 1. When the Scotch tape backing layer is removed (with the adhesive layer), the black material stays on the PET layer (and hence on the photosensitive element) only in the areas which are exposed to IR radiation. The element is overall exposed to UV radiation as in Example 1. The PET barrier layer is stripped off and the element is developed as described in Example 1.

What is claimed is:

1. A process for preparing a relief image which comprises:
   (1) preparing an element having the following layers: (a) a support; (b) a photosensitive layer comprising an initiator having sensitivity to non-infrared actinic radiation and at least one component that is capable of reacting with the initiator after the initiator has been activated by exposure to non-infrared actinic radiation; (c) at least one infrared radiation sensitive layer which is substantially opaque to non-infrared actinic radiation; and (d) a coversheet;
   (2) exposing imagewise the element through layer (d) with infrared laser radiation;
   (3) removing the layer (d) having adhered thereto a part of layer (c), wherein the remaining element consists of layers (a), (b) and a mask consisting of the part of layer (c) not adhered to layer (d);
   (4) exposing overall the remaining element of step (3) with non-infrared actinic radiation through the mask to produce a change in solubility of the exposed photosensitive layer (b) thereby producing a solvent developable product; and
   (5) developing the product of step (4) by treatment with a developer solvent to remove (i) the areas of the photosensitive layer which are more soluble and (ii) the part of layer (c) adhering to the photosensitive layer (b).

2. A process according to claim 1 wherein the photosensitive layer is photosolubilizable.

3. A process according to claim 1 wherein the photosensitive layer is photohardenable.

4. A process according to claim 3 wherein the photohardenable layer comprises a binder, at least one monomer and an initiator, said initiator having sensitivity to non-infrared actinic radiation.

5. A process according to claim 4 wherein the binder is elastomeric and the relief image is used as a flexographic printing plate.

6. A process according to claim 1 wherein the element further comprises at least one barrier layer, (b') between layer (b) and layer (c), such that after removal of layer (d) having adhered thereto a part of layer (c), the remaining element consists of layers (a), (b), (b') and a mask consisting of the part of layer (c) not adhered to layer (d).

7. The process of claim 6 wherein the photosensitive layer (b) is photohardenable and the development step (5) is carried out by removing (i) the infrared-sensitive material which was not removed during step (3), (ii) at least the areas of the barrier layer which were not exposed to actinic radiation, and (iii) the areas of the photohardenable layer (b) which were not exposed to actinic radiation.

8. A process according to claim 7 wherein the photohardenable layer comprises a binder, at least one monomer and an initiator, said initiator having sensitivity to non-infrared actinic radiation.

9. A process according to claim 8 wherein the binder is elastomeric and the relief image is used as a flexographic printing plate.

10. A process according to claim 5 or claim 9 which further comprises the step of:
    (6) backflash exposing the element overall to actinic radiation through the support, said backflash exposure occurring after step (1) and before step (5).

11. A process according to claim 10 wherein step (6) takes place after step (1).

12. A process according to claim 5 or claim 9 which further comprises a post-exposure step after step (5).

13. A process according to claim 5 or 9 which further comprises a detackification treatment after step (5).

14. A process according to claim 13 wherein the detackification treatment comprises exposure to light having a wavelength less than 300 nm.

15. A process according to claim 1 wherein step 5 further comprises developing the product of step (4) by treating with a first developer to remove substantially all of layer (c), followed by treatment with a second developer to remove substantially all of the unexposed areas of the photohardenable layer and at least the unexposed areas of the barrier layer, if a barrier layer is present.

* * * * *